United States Patent [19]

Palermo

[11] Patent Number: 5,761,097
[45] Date of Patent: Jun. 2, 1998

[54] LOGIC TIMING ANALYSIS FOR MULTIPLE-CLOCK DESIGNS

[75] Inventor: Robert J. Palermo, Shoreview, Minn.

[73] Assignee: Unisys Corporation, Blue Bell, Pa.

[21] Appl. No.: 766,112

[22] Filed: Dec. 16, 1996

[51] Int. Cl.[6] .............................. G06F 1/06; H03K 23/42; H03K 23/58
[52] U.S. Cl. ............. 364/569; 371/47.1; 371/48; 395/183.01; 395/183.09; 395/185.08; 395/500; 327/141; 327/152; 364/578
[58] Field of Search ........................... 364/569, 578; 371/22.1, 27.4, 30, 47.1, 48, 57.1, 61, 62; 395/180, 183.01, 183.09, 185.08, 500, 920, 921; 327/141, 144, 152; 307/409; 326/93, 94, 96; 360/51; 365/233; 377/78, 80, 104; 375/354, 357; 324/532, 535

[56] References Cited

U.S. PATENT DOCUMENTS

| | | | |
|---|---|---|---|
| 5,323,401 | 6/1994 | Maston | 371/27 |
| 5,381,416 | 1/1995 | Vartti et al. | 371/1 |
| 5,381,524 | 1/1995 | Lewis et al. | 395/161 |
| 5,428,626 | 6/1995 | Frisch et al. | 371/27 |
| 5,452,239 | 9/1995 | Dai et al. | 364/578 |
| 5,455,931 | 10/1995 | Camporese et al. | 395/550 |
| 5,475,830 | 12/1995 | Chen et al. | 395/500 |
| 5,550,760 | 8/1996 | Razdan et al. | 364/578 |
| 5,576,979 | 11/1996 | Lewis et al. | 364/578 |
| 5,579,510 | 11/1996 | Wang et al. | 395/500 |
| 5,633,879 | 5/1997 | Potts et al. | 371/27 |
| 5,644,498 | 7/1997 | Joly et al. | 364/489 |
| 5,649,167 | 7/1997 | Chen et al. | 395/500 |
| 5,650,938 | 7/1997 | Bootehsaz et al. | 364/490 |
| 5,654,898 | 8/1997 | Roetcisoender et al. | 364/490 |
| 5,655,109 | 8/1997 | Hamid | 395/500 |
| 5,694,579 | 12/1997 | Razdan et al. | 395/500 |

*Primary Examiner*—James P. Trammell
*Assistant Examiner*—Patrick Assouad
*Attorney, Agent, or Firm*—Charles A. Johnson; Mark T. Starr; Merchant, Gould, Smith, Edell, Welter & Schmidt

[57] ABSTRACT

A system and method for detecting timing design errors in a design having multiple state devices clocked by multiple clock signals. The design includes at least first and second state devices clocked by first and second clock signals. A reference time is designated, and a time differential between successive triggering edges of the first and second clock signals is calculated. The time of the occurrence of each triggering edge of the first and second clock signal is calculated with respect to the reference time, rather than directly with respect to each other. The calculation of the time differential includes storing a period time and a time offset the first and second clock signals. The time offsets are time durations measured from the reference time to the first pulse of each of the first and second clock signals that occur simultaneously with, or subsequent to, the reference time. The calculated time differential is then compared to the known, worst-case timing parameters to determine whether a timing error exists.

27 Claims, 10 Drawing Sheets

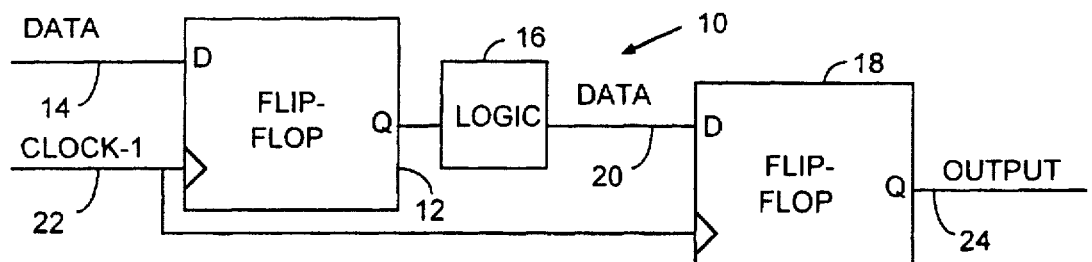
(PRIOR ART) FIG. 1
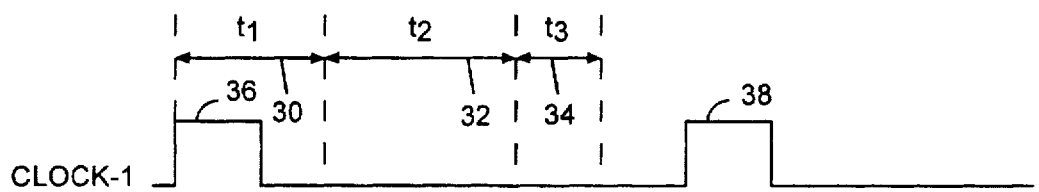
(PRIOR ART) FIG. 2
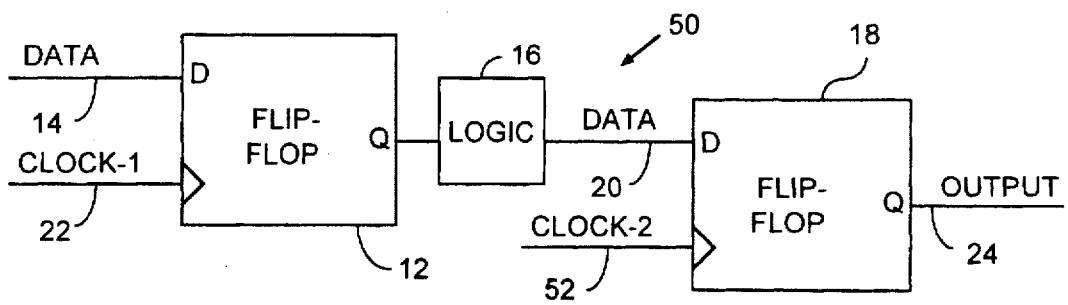
(PRIOR ART) FIG. 3
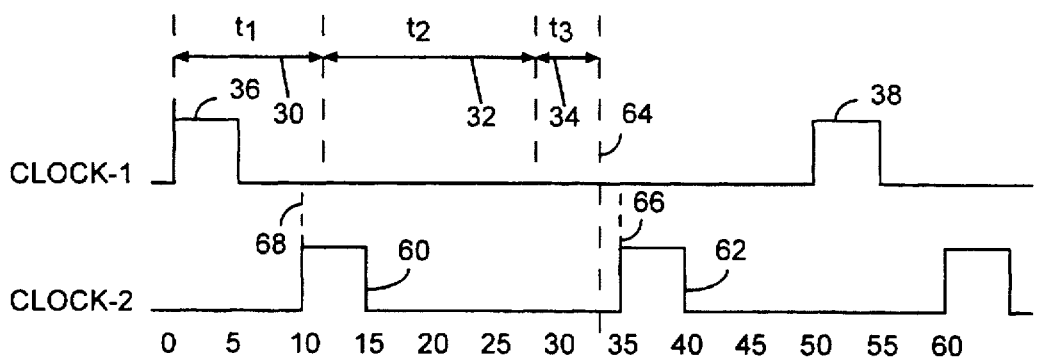
(PRIOR ART) FIG. 4

5,761,097

LOGIC TIMING ANALYSIS FOR MULTIPLE-CLOCK DESIGNS

BACKGROUND OF THE INVENTION

1. Field of the Invention

This invention relates generally to timing analysis systems, and more particularly to a system and method for accurately detecting timing errors in a logic system having multiple state devices clocked by multiple clock signals.

2. Description of the Prior Art

Computer-aided design (CAD) and computer-aided engineering (CAE) tools have been, and continue to be, very important in the development of circuits and systems. The high cost of hardware development has propelled the increase in computer-aided design, where systems can be designed, simulated, and tested with the help of computers.

Circuit analysis and simulation has traditionally been an active area in computer-aided design. The component libraries of sophisticated CAD/CAE systems contain much more than a mere symbol for the different components, and usually contain a component "model" describing the device's logical and electrical operation. Component models, along with the interconnection information in the schematic, can be used to find design errors. One such category of design errors includes timing errors, that indicate timing problems related to input-to-output propagation times, setup times, and hold times for clocked devices. The setup time is the length of time that data must be present and unchanging at the data input of a state device before the state device is clocked. The hold time is the length of time after the clocking of a state device in which the input data must remain unchanged. Worst-case delay paths are readily available from the component models and interconnection netlist. Using this information, a timing analysis tool can find the worst-case delay paths in the circuit, thereby allowing the designer to determine the adequacy of the timing margins.

One of the timing analysis verifications performed by such a timing analysis tool involves determining whether hold and setup time values can be met as defined by the clock period of the state devices' clock signal. To perform this verification, the analysis tool calculates the entire propagation delay in a data path, then determines if the data will be setup at the input of a destination state device before the associated common clock pulse occurs. The analysis tool further checks for "hold violations", where the data arrives so early at a destination state device so as to interfere with the previous signal departure from that state device. The examples used herein are directed toward setup timing analysis; however, clock time determination for hold timing analysis will become apparent to those skilled in the art from the following description.

FIG. 1 is a block diagram of a circuit 10 illustrating the above timing analysis verification for a single-clock system. The worst-case propagation delay for the circuit 10 of FIG. 1 is calculated by adding three delay values. The first delay value (delay 1) is the clock input to data output delay through the source flip-flop 12. The second delay value (delay 2) is the maximum propagation delay of the combinational logic 16. The third delay value (delay 3) is the setup time of the flip-flop 18. The setup time is the length of time that the data on line 20 must be present and unchanging before flip-flop 18 is clocked. The total delay must not be greater than the clock period in the single-clock system. In other words, (delay 1)+(delay 2)+(delay 3) must not be greater than the clock period of the clock-1 signal on line 22. If the total delay is greater than this clock period, the data will not be properly set up at the destination flip-flop 18 when it is clocked, and the output signal on line 24 will be unpredictable.

FIG. 2 is a waveform diagram illustrating the delays with respect to the clock period of the clock-1 signal on line 22. Delay 1, delay 2 and delay 3 as described in FIG. 1 are shown as $t_1$ on line 30, $t_2$ on line 32, and $t_3$ on line 34 respectively. In order for the circuit 10 of FIG. 1 to meet its setup times, the sum of the $t_1$, $t_2$ and $t_3$ signals must be less than the period of the clock-1 signal on line 22. As is well-known in the art, the period of the synchronous clock-1 signal is the time between like edges of pulses 36 and 38.

However, many circuits are not driven by a common clock. Multiple-clock systems include circuits that are driven by different clocks, which introduces another factor into the above setup time calculation. Although timing analysis tools may exist for calculating such setup times, these prior art tools fail to locate some of the worst timing violations. These prior art timing analysis tools do not maintain a frame of reference for the various design clocks with respect to one another. Rather, these tools assume that the clock pulse edge nearest the data pulse at the destination state device is the clock pulse edge to be used in the timing analysis. As is shown in FIG. 3, this assumption is not necessarily correct, and can lead to erroneous timing analysis results.

Referring now to FIG. 3, a circuit 50 having components clocked by multiple clocks is shown. The circuit 50 is similar to the circuit 10 of FIG. 1, with the exception of an additional clock signal, labeled the clock-2 signal on line 52. As was true with respect to FIG. 1, the data propagation delay is measured from the arrival of the clock-1 signal on line 14 at flip-flop 12 to the arrival of valid data at flip-flop 18. The data on line 14 must reach flip-flop 18 early enough to account for the setup time in relation to a clock-2 rising clock edge. The problem is determining "which" one of the clock-2 signal's clock pulses provides the triggering edge for the data on line 20. If an assumption is made that it is a clock pulse of the clock-2 signal on line 52 which is nearest to the occurrence of the data in which the data on line 20 must be setup, then a timing error could go undetected if the data was actually suppose to be setup prior to any of the "preceding" clock pulses of the clock-2 signal.

FIG. 4 is a waveform diagram illustrating the delays with respect to the clock periods of the clock-1 and clock-2 signals on lines 22 and 52 respectively. The aforementioned problem associated with the assumption that the clock signal "nearest" the occurrence of the data can be seen with reference to FIG. 4. Again, delay 1, delay 2 and delay 3 are shown as $t_1$ on line 30, $t_2$ on line 32, and $t_3$ on line 34 respectively. The clock-1 signal on line 22 has first pulse 36 and second pulse 38. The clock-2 signal on line 52 shows a first pulse 60 and a second pulse 62. If it is assumed that pulse 62 is the pulse which is to clock flip-flop 18, it would incorrectly appear that the timing is acceptable, as the sum delay $t_1+t_2+t_3$ occurs at the time represented by line 64, which is prior to the active edge of pulse 62 represented by line 66. However, as can be seen, the "next" clock edge of the clock-2 signal is actually pulse 60 rather than pulse 62, and therefore the triggering edge which should be used in the timing analysis is the active high edge of pulse 60 represented by line 68. A system which assumes that the clock pulse occurring nearest the data signal can therefore produce erroneous results by using pulse 62 at time t=35 ns rather than using the correct pulse 60 at time t=10 ns.

There is a need, therefore, for a timing analysis tool that accurately performs timing analysis in multi-clock logic designs. The present invention provides a solution to these and other problems, and offers other advantages over the prior art.

OBJECTS

It is a primary object of this invention to provide an improved-accuracy timing analysis method.

It is another object of the invention to provide a timing analysis tool that accurately detects timing variances between triggering clock signals in multi-clock systems.

It is still another object to provide a reference time for which the timing variances between triggering clock signals can be accurately compared.

It is yet another object of the invention to accurately detect the first occurrence of a triggering clock signal at a destination state device following a triggering clock signal at a source state device.

It is another object of the invention to accurately detect the triggering clock signal at the source state device which is nearest to, yet earlier than, the triggering clock signal at the destination state device.

Other more detailed objectives will become apparent from a consideration of the Drawings and the Detailed Description of the Preferred Embodiment.

SUMMARY OF THE INVENTION

The present invention relates to a system and method for detecting timing design errors in a system having multiple state devices clocked by multiple clock signals.

In accordance with one embodiment of the invention, a method for detecting timing errors in a system having first and second state devices clocked by first and second clock signals is provided. The first and second state devices, and any intermediate combinational logic, have known, worst-case timing parameters associated with them. A reference time is designated, and a time differential between successive triggering edges of the first and second clock signals is calculated. The time of the occurrence of each triggering edge of the first and second clock signal is calculated with respect to the reference time, rather than directly with respect to each other. The calculated time differential is then compared to the known, worst-case timing parameters to determine whether a timing error exists.

In accordance with another embodiment of the invention, the calculation of the time differential includes the storing of a period time and a time offset the first and second clock signals. The time offsets are time durations measured from the reference time to the first pulse of each of the first and second clock signals that occur simultaneously with, or subsequent to, the reference time. A current clock time is set equal to the time offset of the first clock signal, and a variance time from this current clock time to the time of the next triggering edge of the second clock signal is then calculated. The stored period times of the clock signals assist in locating the appropriate triggering edges of the clock signals used in the analysis.

In accordance with another embodiment of the invention, a system for detecting timing errors in a state machine is provided. The state machine includes at least first and second state devices clocked by first and second clock signals respectively. The state machine also includes a user interface to enter a reference time, and to enter offset values for each of the first and second clock signals, where the offset values represent a time offset from the reference time. A storage mechanism stores the reference time and the offset values for the first and second clock signals. A processing unit is programmed to calculate a time differential between successive triggering edges of the first and second clock signals, as measured from their respective offset values. The processing unit also compares expected timing parameters to the calculated time differential, to determine the existence of timing errors in the state machine design.

In accordance with yet another embodiment of the invention, a computer program product for use with a computer system is provided. The computer system provides for detecting timing errors in a state machine having at least a first and a second state device clocked by first and second clock signals. The computer program product includes a computer-readable medium, which has computer program code embodied thereon. The computer program code includes program code for designating a reference time for a timing analysis. The program code then provides for calculating a time differential between successive triggering edges of the first and second clock signals as measured from this reference time. This time differential is then compared to expected timing parameters to the time differential, to determine the existence of timing errors in the state machine design.

In accordance with still another embodiment of the invention, a method for analyzing timing characteristics in a system having a network of state devices is provided. Clock signal parameters are assigned to each of the state devices. Signal trace delay information is calculated using the clock signal parameters. The signal trace delay information is calculated for each signal path from initial state devices to successive state devices, and from those successive state devices to state devices successively coupled to those state devices to eventually calculate the signal trace delay information for the entire network. The calculation includes storing the signal trace delay information for each signal path while propagating through the network of state devices. This stored information is used while progressively propagating through each stage of the state device by calculating the signal trace delay information at each state device as measured from the stored signal trace delay information from preceding stages, rather than measured from a common time reference. Therefore, signal trace analysis does not require returning to a common reference time, but rather only one pass through the network is required. This is accomplished through storing required information as the timing analysis is propagated through the network.

Still other objects and advantages of the present invention will become readily apparent to those skilled in this art from the following detailed description, where the preferred embodiment of the invention is shown by way of illustration of the best mode contemplated of carrying out the invention. As will be realized, the invention is capable of other and different embodiments, and its details are capable of modification without departing from the invention. Accordingly, the drawing and description are to be regarded as illustrative in nature, and not as restrictive.

BRIEF DESCRIPTION OF THE DRAWINGS

FIG. 1 is a block diagram of a circuit illustrating a timing analysis verification for a single-clock system;

FIG. 2 is a waveform diagram illustrating the timing delays with respect to a single clock period;

FIG. 3 is a block diagram of a circuit illustrating a timing analysis verification for a multi-clock system;

FIG. 4 is a waveform diagram illustrating the timing delays with respect to the clock periods of the multiple clocks of FIG. 3;

DETAILED DESCRIPTION OF THE PREFERRED EMBODIMENT

Figure 5:
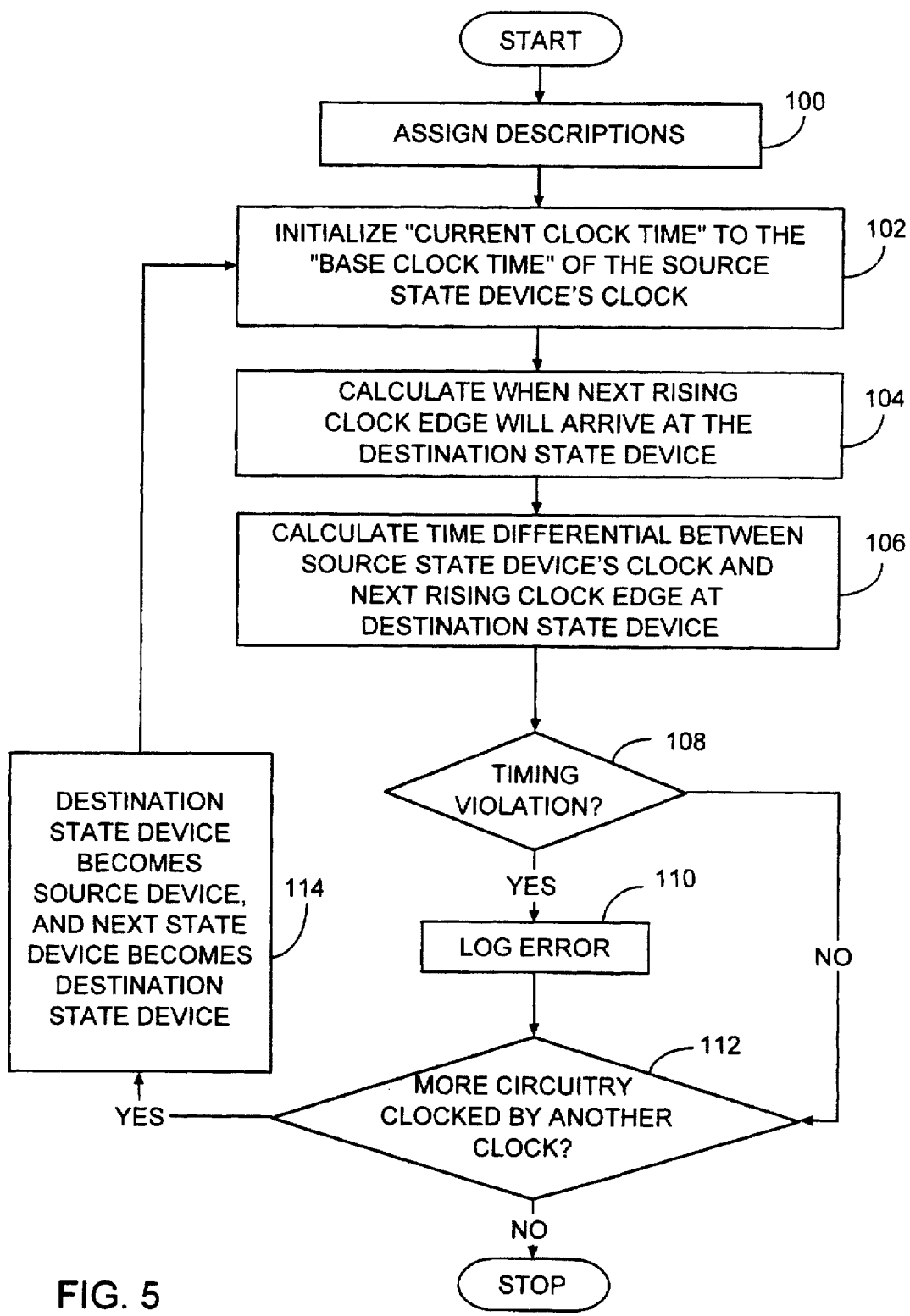
FIG. 5 is a general flow diagram illustrating one embodiment of the invention.

FIG. 5 is a general flow diagram of one embodiment of the invention. Processing begins at the assign descriptions step 100, where every clock signal in the system is assigned a description. The description includes at least the clock period, and an offset. This offset, referred to as the "base clock time," describes the lapse occurring from some arbitrarily chosen time t=0 to the first rising edge of that particular clock signal. The assign descriptions step 100 is described in more detail in FIG. 6 and its corresponding description.

When every clock signal in the design has been assigned a description, this information can be used to determine the allowable propagation delays for timing verification purposes. Step 102 includes the initialization of a "current clock time" to equal the "base clock time" of the source state device's clock. The "current clock time" is the time at which a particular state device receives a triggering clock edge which will launch or trigger the data as the data progresses through the series of state devices. For the first state device, the current clock time is essentially the base clock time of a particular clock signal, which is typically stored at a scratch-pad memory location.

Step 104 uses the current clock time to determine when the next rising clock edge will arrive at the destination state device. In order to determine whether a timing violation exists, the time between the triggering clock edge at the source state device and the next triggering clock edge at the destination state device must be known. It is this time that the propagation and setup times are compared with to determine the existence of a timing violation. It is important for a timing analysis system to be able to identify the correct triggering clock edge at the destination state device, and an assumption that the clock pulse nearest the time of the input data may result in an indication that the analysis was successful when in fact it was not. Step 104 is described in greater detail in connection with the description of FIG. 9.

An adjustment may also be needed to verify setup (and hold) times. Where the frequency of the clock signal for the destination state device is less than the clock signal for the source state device, multiple clock signal pulses at the source state device can occur before the triggering clock pulse at the destination state device. Step 106 calculates the time differential between the source state device's clock and the next triggering clock edge at the destination state device. This step is needed to ensure that the most recent clock pulse at the source state device is used in the calculation of the relevant time differential. For example, it is possible that the clock signal to the source state device pulses three times prior to the next triggering edge of the clock signal at the destination state device. The system must be able to locate the clock pulse for the source state device that immediately precedes the occurrence of the triggering edge at the destination state device. The preferred method for which the present invention performs this task is described in the description of FIG. 10.

Referring again to FIG. 5, the determination of whether a timing violation exists occurs at decision step 108. At step 108, the calculated times between the triggering clock signals for the source and destination state devices are compared to the expected timing parameters associated with the particular state devices and combinational logic in the system under test. These expected timing parameters can be obtained from the component libraries of the CAD/CAE system. Worst-case delay paths are readily available from the component models and interconnection netlist.

The preferred timing analysis system therefore compares the calculated time between the relevant clock signal triggering pulses and these expected timing parameters. The timing parameters include the propagation delays and setup times for the circuits in the system under test. In the preferred embodiment this comparison is driven by program code. Sums and comparisons of numerical values using software is well-known in the art.

If a timing violation is found to exist, an error is logged at step 110, and processing continues at decision step 112. If a timing violation is not found, no error is logged, and processing moves directly from decision step 108 to decision step 112.

Decision step 112 determines whether additional circuitry exists which is to be clocked by yet another clock signal. If no other state devices exist, processing stops. If other state devices do exist, the entire process is repeated for the state devices. Step 114 designates the previously designated destination state device to be the new "source" state device. The next state device in the state design, which is clocked by a clock signal different than the clock signal for the new source state device, is then designated as the new "destination" state device. Processing then returns to step 102, where the entire process is repeated to determine the calculated time variance between the triggering clock signals for the new source and new destination state device.

Figure 7:
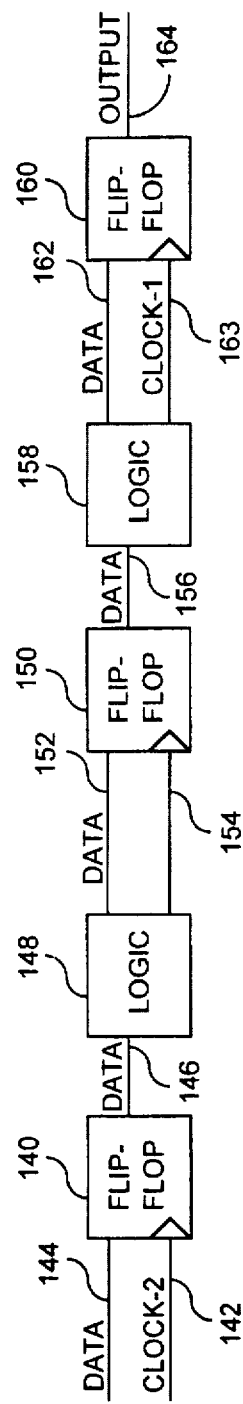
FIG. 7 is a block diagram of a typical logic system having three clock signals providing signals to three different state devices.

FIG. 5 illustrates the general flow of a method of detecting timing errors w/i a "series" of state devices, such as the series of flip-flops illustrated as will be seen in FIG. 7. However, as will be appreciated by those skilled in the art, the general flow diagram of FIG. 5 is also applicable to "networks" of state devices. Such a network of state devices may include particular source state devices being coupled to multiple destination devices. Furthermore, the destination state devices may receive signals from multiple source state devices. This results in a network of interconnected state devices, in which case the general flow of FIG. 5 is applicable to each of the interconnected state devices. A relatively simple example of a network of state devices will be described in connection with FIG. 14.

Figure 6:
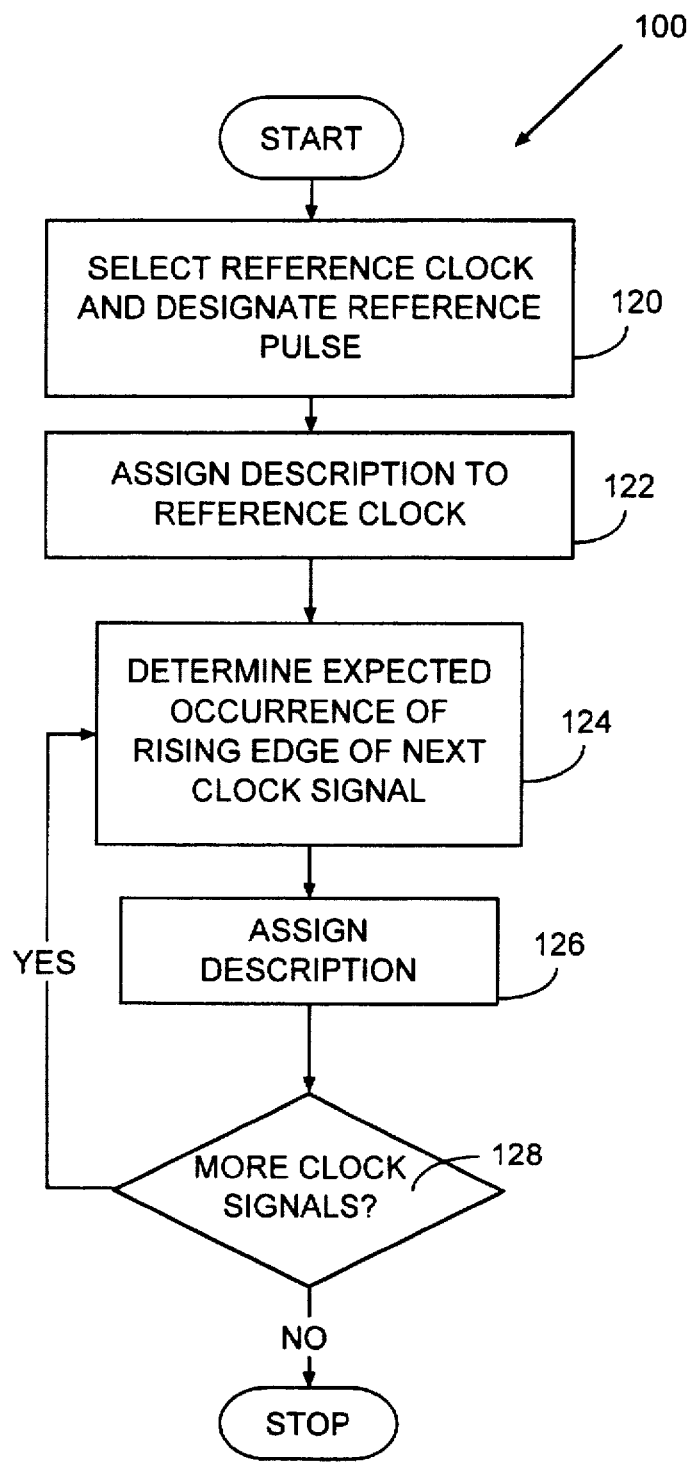
FIG. 6 is a flow diagram of the assigning descriptions step of FIG. 5.

Referring now to FIG. 6, a flow diagram of the step 100 of assigning descriptions is shown. The process starts upon selection of a "reference clock" at step 120. The reference clock is used to provide a time reference for all of the clock signals in the state design. In the preferred embodiment, one of the clock signals is used to provide a reference pulse at an arbitrarily chosen time t=0.

A "description" is then assigned to the reference clock at step 122. The description includes the period of the reference clock, and an offset. Since the expected frequency of the reference clock will be known, the clock period is easily calculated. The offset, referred to as the "base clock time", describes the lapse occurring from the reference pulse to the first rising edge of the particular clock under consideration. The offset for the reference clock will be zero, since the reference pulse and the first rising edge are one in the same.

The next step 124 includes determining the expected occurrence of the launching edge (which is the rising edge in the preferred embodiment) of the first clock pulse following the reference pulse of the next clock signal. This next clock signal is any clock signal that provides a clock for any of the state devices. The reference pulse is set to be time t=0, and the next occurrence of the launching edge of the particular clock signal will occur at some time after time t=0. This time will be the offset, or the "base clock time" for that particular clock signal. This base clock time, and the period for the particular clock signal, are stored as that clock signal's "description" at step 126.

Processing continues to decision step 128, where it is determined whether more clock signals exist that clock state devices. If no more clock signals exist, processing stops. If additional clock signals do exist that clock state devices, processing returns to step 124, where the occurrence of the launching edge of the next expected pulse of that clock signal is determined, so that the description for that clock signal can be stored at step 126. This process continues until all clock signals in the system have been assigned a "description", which includes the offset and the clock period.

Figure 8:
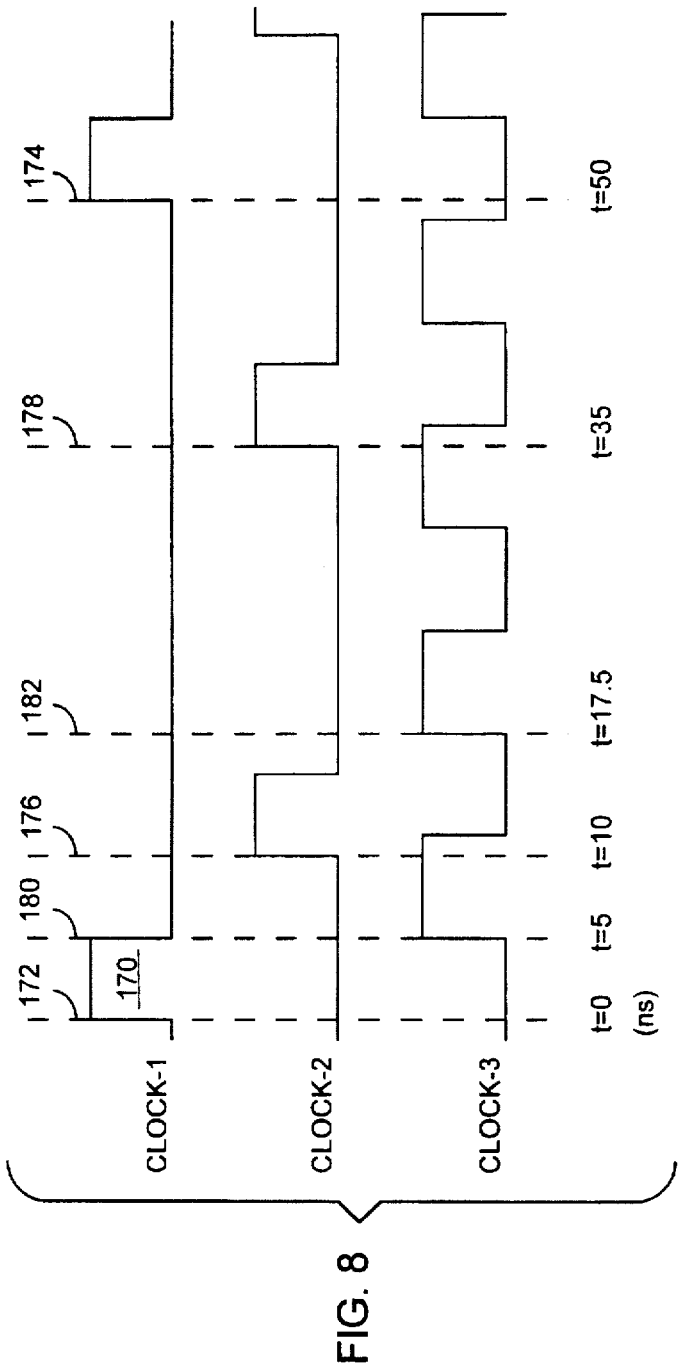
FIG. 8 is a waveform diagram illustrating how the descriptions are assigned to the various clock signals of the circuit of FIG. 7.

Referring now to FIGS. 7 and 8, the process of assigning descriptions to the various clock signals is shown. FIG. 7 is a block diagram of a typical logic system having three clock signals providing signals to three different state devices. The first state device is a flip-flop 140, which is clocked by the clock-2 clock signal on line 142. The data on line 144 passes through flip-flop 140 when the active edge of the clock-2 clock signal occurs. The resulting data on line 146 passes through combinational logic 148, which then provides the data to flip-flop 150 on line 152. The clock-3 clock signal on line 154 provides the clocking for this state device, which passes the data on line 152 to its output on line 156 when the active edge of the clock-3 clock signal occurs. The data on line 156 may again pass through more combinational logic 158 on its way to the third state device, shown as flip-flop 160. The data on line 162 is available at the output of flip-flop 160 on the occurrence of the active edge of the clock-1 clock signal on line 163, thereby producing a final output signal on line 164. The circuit of FIG. 7 therefore illustrates a typical system including state devices having multiple clock signals.

FIG. 8 is a waveform diagram illustrating how the descriptions are assigned to the various clock signals of the circuit of FIG. 7. The "reference clock" has been selected to be a pulse 170 the clock-1 clock signal on line 163. Since the active edge of the reference pulse 170 and the resulting reference time t=0 necessarily coincide, the offset time is zero. The active edge of the reference pulse 170 and the reference time t=0 are represented by the dashed line 172. The other portion of the description for the clock-1 signal is its clock period, which is 50 nanoseconds. This is evident from the next active edge of the clock-1 signal on line 163, which occurs at time t=50 and is represented by line 174.

Similarly, the first rising clock edge of the clock-2 clock signal on line 142 arrives 10 nanoseconds after time t=0, and therefore the clock-2 signal has a base clock time of 10 ns. This is calculated by subtracting the reference time (zero) from the time at which the active edge occurs shown at time t=10 at line 176. The clock-2 signal has a period of 25 nanoseconds, as can be calculated by subtracting the time t=10 at line 176 from time t=35 at line 178. The clock-3 clock signal on line 154 arrives 5 nanoseconds after time t=0, as shown at time t=5 at line 180. The clock-3 signal has a period of 12.5 ns, as can be calculated by subtracting the time t=5 at line 180 from time t=17.5 at line 182. In this way, all descriptions for all clock signals can be assigned, as described in step 100 in the flow diagram of FIG. 6.

Figure 9:
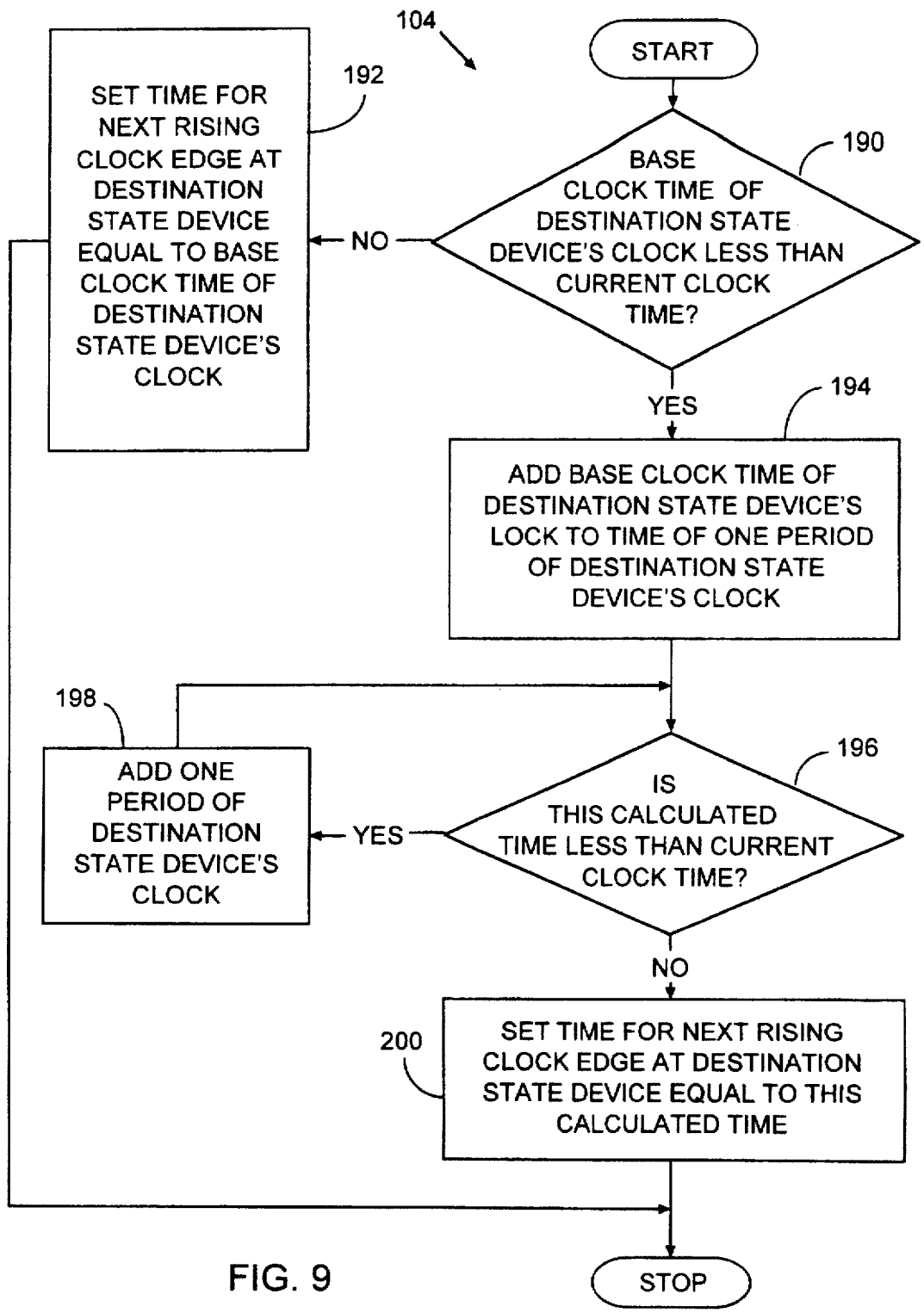
FIG. 9 is a flow diagram detailing the destination clock edge calculation step of FIG. 5.

FIG. 9 is a flow diagram detailing the destination clock edge calculation step 104 of FIG. 5. Step 104 uses the current clock time to determine when the next rising clock edge will arrive at the destination state device. An assumption that the clock pulse nearest the time of the input data may result in an indication that the analysis was successful when in fact it was not.

The destination clock edge calculation step 104 begins at decision step 190, where the base clock time of the destination state device's clock signal is measured against the current clock time. The current clock time was set to be the offset of the clock signal for the source state device. If the base clock time of the destination state device is greater than the current clock time, it means that the next triggering edge of the destination state device's clock signal must necessarily be the time that the "next" rising clock edge arrives at the destination state device. This is seen at step 192, which sets the time of the next rising (active) edge of the destination state device's clock signal to equal the base clock time of the destination state device's clock signal.

However, where the base clock time of the destination state device is less than or equal to the current clock time, further analysis is required. Step 194 indicates that where the base clock time of the destination state device is less than or equal to the current clock time, one base clock time of the destination state device's clock signal must be added to the time of one period of the destination state device's clock signal. The base clock time and the period are both stored as part of the clock signal's "description", which are assigned in step 100 of FIG. 5. By adding one period of the clock signal of the destination state device to its base clock time, the time in which the next pulse of that clock signal, subsequent to the base clock time, can be determined.

The calculated time in which this "next pulse" occurs is again measured against the current clock time at decision step 196. If this calculated time is again less than or equal to the current clock time, processing continues at step 198, where one period of the destination state device's clock is added to this calculated time, which is again checked to determine whether it is less than or equal to the current clock time in decision step 196. One reason for adding clock period times to the destination state device's clock is in the case where the frequency of the destination state device's clock signal is greater than the clock signal for the source state device. In other words, many destination state device clock signals may transpire before one is reached which is subsequent to the active edge of the clock signal of the source state device.

Steps 196 and 198 continue to execute until the calculated time is greater than the current clock time, at which time processing continues at step 200. Step 200 sets the time for the next rising clock edge of the destination state device to equal the calculated time determined in steps 196 and 198. Once this "next rising clock edge" time is calculated, processing of step 104 of FIG. 5 is complete.

Figure 10:
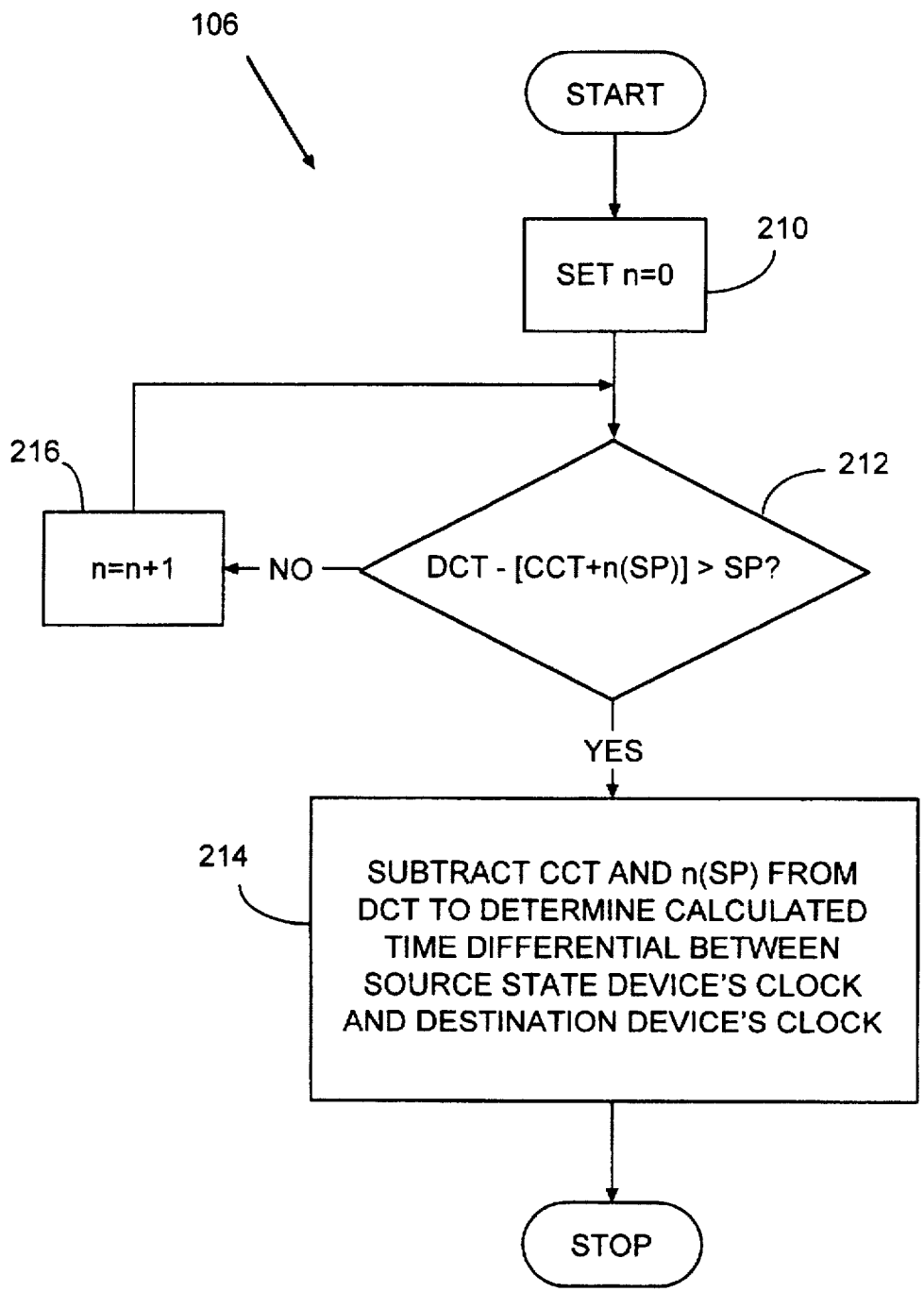
FIG. 10 is a flow diagram detailing the time differential calculation step of FIG. 5.

FIG. 10 is a flow diagram detailing the time differential calculation step 106 of FIG. 5. This step is needed to ensure that the most recent clock pulse at the source state device is used in the calculation of the relevant time differential. Processing begins at step 210, where a variable "n" is set to zero. Decision step 212 then determines whether multiple clock pulses of the source state device's clock signal occurred prior to a clock pulse of the destination state device. One method of performing this calculation is shown in decision step 212, where the following formula is solved:

$$DCT-[CCT+n(SP)]>SP \qquad \text{[Equation 1]}$$

where
DCT=Destination Clock Time;
CCT=Current Clock Time;
SP=Source Period.

Step 212 is locating a clock signal for the source state device that immediately precedes the triggering pulse of the clock signal for the destination state device. The current clock time (CCT) is added to multiples of the period of the source state device's clock signal. When the difference between the destination clock time (DCT), which was calculated in step 104 of FIG. 5, and this sum is less than or equal to one period of the source state device's clock signal, the immediately preceding clock pulse of the source state device's clock signal has been found, and processing continues at step 214. Until this occurs, step 216 adds one to the variable "n" to account for another source period time, and processing returns to decision step 212. This continues until the difference between the destination clock time, and the sum of CCT and n(SP) is less than or equal to one period of the source state device's clock signal.

Step 214 determines the actual time differential between the relevant clock signal of the source state device and the triggering edge of the destination state device. This occurs by subtracting the current clock time (CCT) and the number of period multiples calculated [n(SP)] from the destination clock time (DCT). When this value has been calculated, processing of step 106 of FIG. 5 stops.

Figure 11:
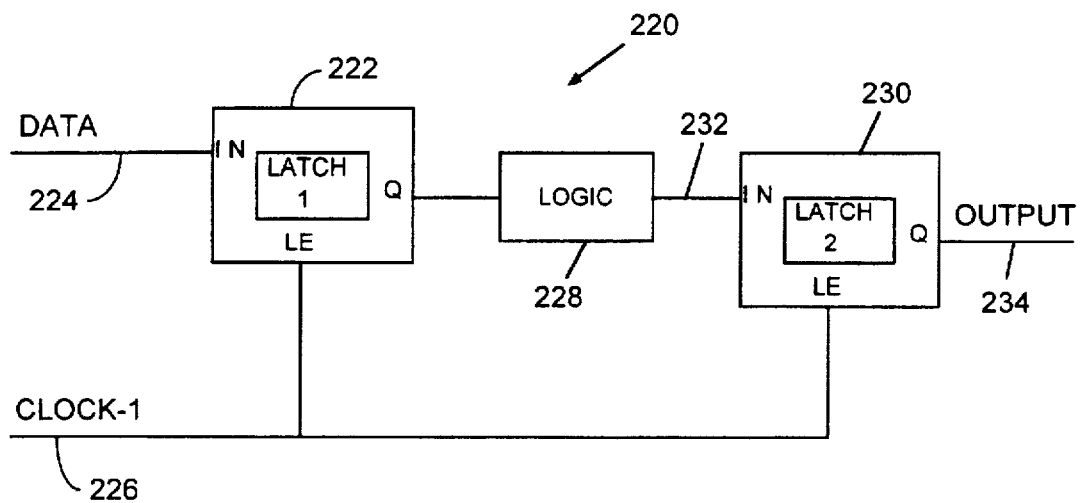
FIG. 11 is a block diagram of a circuit including latches, rather than flip-flops, as the state devices.

Referring now to FIG. 11, a block diagram of a circuit 220 where the state devices are latches rather than clocked flip-flops. Worst-case propagation delays are determined in a somewhat different manner than the worst-case propagation delays where the state devices are flip-flops. FIG. 11 illustrates a single clock system in which the present invention can perform a timing analysis.

Latch-1 222 receives data at its input terminal labeled IN via line 224. This data is transmitted to the output terminal, labeled Q, when the latch enable, labeled LE has been asserted. A single clock signal labeled CLOCK-1 on line 226 provides the signal to the latch enable LE. One difference between the latches of FIG. 11 and flip-flops of previous diagrams is the time at which a signal is latched at the output Q. For a flip-flop, the output is latched on the triggering edge of the CLOCK-1 signal on line 226. For a latch, the data at the input is transferred to the output at output terminal Q during the time that the CLOCK-1 signal on line 226 is asserted at the latch enable LE input terminal. Therefore, the data is latched at the output Q when the CLOCK-1 signal is no longer at an active logic level. In one embodiment of the invention, the CLOCK-1 signal on line 226 is an active high logic level signal, and the data signal is latched at the output Q on a high-to-low pulse transition edge.

The timing analysis is therefore different where the state devices include latches rather flip-flops, as the triggering time is different between these two general types of devices. For example, the latch-1 222 allows a longer delay for valid data to be entered on line 224 than if device 222 were a flip-flop. This is a result of the triggering time for the flip-flop being the leading triggering edge of the active clock pulse, and the triggering time for a latch device being the trailing pulse edge of the active clock pulse. The present invention accounts for the timing analysis of both latching devices and flip-flop devices.

As was true in the case of flip-flops, additional delays may occur due to the propagation delays of combinational logic 228. An additional propagation delay occurs due to another series latching device, labeled latch-2 230. This latch receives its data input from the combinational logic 228 via line 232 at the input terminal labeled IN. The latch enable terminal of the latch-2 230 is also controlled by the CLOCK-1 signal on line 226. When the CLOCK-1 signal is active at the latch enable LE input, the data on line 232 at the input of latch-2 230 is transferred to the output Q to line 234. The data therefore propagates through the circuit 220 as the CLOCK-1 on line 226 provides triggering pulses to the latch enables on latches 222 and 230.

Figure 12:
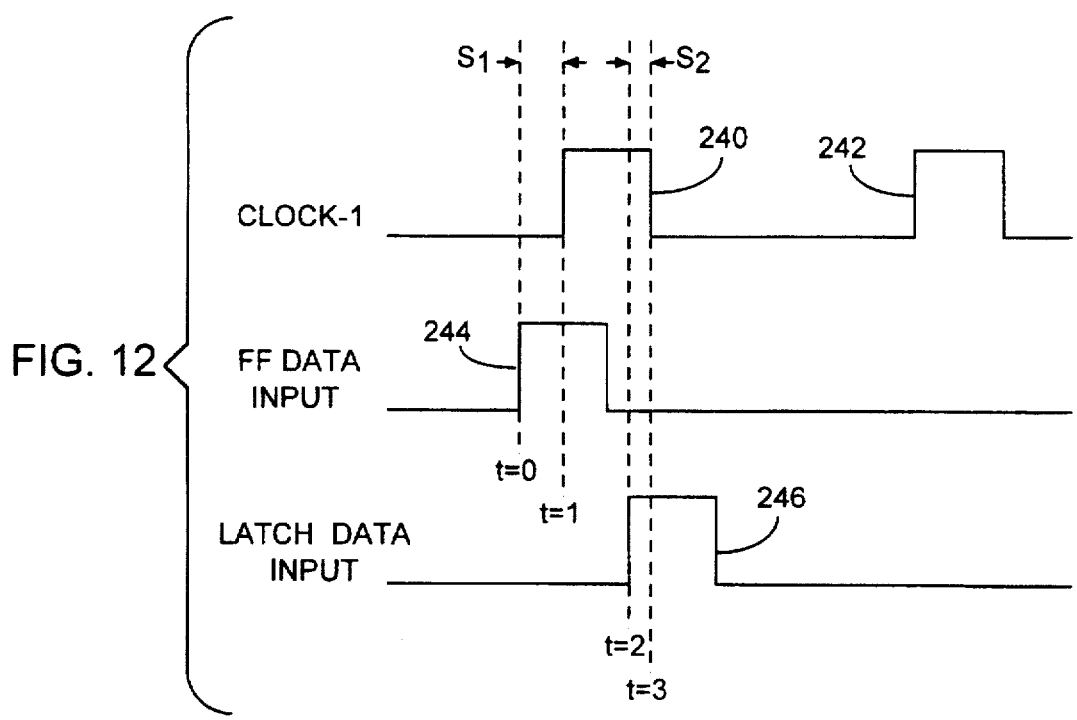
FIG. 12 is a waveform diagram illustrating the comparison of triggering edges for flip-flops and latches.

FIG. 12 is a waveform diagram illustrating the comparison of triggering edges for flip-flops and latches. The CLOCK-1 signal on line 226 of FIG. 11 is shown having a first active pulse 240 and a second active pulse 242. Data at a flip-flop data input is shown as pulse 244, and data at a latch data input is shown as pulse 246.

A first setup time $S_1$ between times t=0 and t=1 represents the time at which valid data must be at the data input of a particular flip-flop prior to the active triggering edge (rising edge) of the CLOCK-1 signal. The data must therefore be present a time $S_1$ prior to the occurrence of the CLOCK-1 signal in order for the data to be recognized and latched at the output of the flip-flop.

A second setup time $S_2$ between times t=2 and t=3 represents the time at which valid data must be at the data input of a particular latch, such as LATCH-1 222 of FIG. 11, prior to the latching edge of the CLOCK-1 signal. While the CLOCK-1 signal is active (logic level high in this example), the data at the latch data input will be available at the latch output. However, valid data present at the latch data input at the time the active pulse returns to a non-active level is latched at the latch output.

Referring again to FIG. 11, the base clock time, current clock time, latching clock time, and arrival times can be calculated for a particular CLOCK-1 signal on line 226. As was previously described, the "base clock time" (BCT) describes the lapse occurring from some arbitrarily chosen time t=0 to the first active edge (the rising edge in the example of FIG. 11) of that particular clock signal. Also, the "current clock time" (CCT) is the time at which a particular state device receives a triggering clock edge which will latch the data as the data progresses through the series of state devices. The CCT is typically stored at a scratch-pad memory location. The "latching clock time" (LCT) is the actual time at which the data is latched at a particular state device. The "arrival time" (AT) is the time at which data arrives at a particular state device.

For example, for the single-clocked latch design of FIG. 11, a clock signal waveform having the characteristics illustrated in TABLE 1 can be assumed (illustrated in relative units, typically nanoseconds):

TABLE 1

| PERIOD | PULSE WIDTH | TIME OF FIRST PULSE ACTIVATION |
|--------|-------------|--------------------------------|
| 12     | 5           | 0                              |

For a design having the above characteristics, and where latch-1 222 and latch-2 230 are referred to as L1 and L2 respectively, the following equations apply:

$BCT(L1)=0$ [Equation 1.1]

$BCT(L2)=0$ [Equation 1.2]

$CCT(L1)=0$ [Equation 1.3]

$CCT(L2)=12$ [Equation 1.4]

$LCT(L2)=17$ [Equation 1.5]

$AT(L2)=D(L1.LE,L1.Q)+D(L1.Q,L2.IN)$ [Equation 1.6]

Therefore, in order for the data to be properly latched at latch-2 230 (L2):

$AT(L2)+S(L2) \leq 17$ [Equation 1.7]

where AT(L2) is the arrival time of the data at the L2 latch, and S(L2) is the setup time for the L2 latch. As Equation 1.6 illustrates, the arrival time at the L2 latch is the delay from the L1 latch enable (LE) to the L1 latch output (Q), plus the delay from the L1 latch output (Q) to the L2 data input (IN). The setup time for L2 is then added to the arrival time for L2 to obtain a total time which is used in the timing analysis.

A similar result occurs for a single-clocked flip-flop design having the parameters of Table 1 and being similar to that of FIG. 11, with the exception of flip-flops replacing the latches. However, because flip-flops are edge-triggered on the active edge of the clock signal (e.g., CLOCK-1 signal) rather than level-sensitive as a latch enable, the arrival time calculation is somewhat different, as shown in the following equations:

$BCT(F1)=0$ [Equation 2.1]

$BCT(F2)=0$ [Equation 2.2]

$CCT(F1)=0$ [Equation 2.3]

$CCT(F2)=12$ [Equation 2.4]

$LCT(F2)=12$ [Equation 2.5]

$AT(F2)=D(F1.C,F1.Q)+D(F1.Q,F2.IN)$ [Equation 2.6]

$AT(F2)+S(F2) \leq 12$ [Equation 2.7]

where AT(F2) is the arrival time of the data at the F2 flip-flop, and S(F2) is the setup time for the F2 flip-flop. As Equation 2.6 illustrates, the arrival time at an F2 flip-flop is the delay from the F1 clock input (C) to the F1 flip-flop output (Q), plus the delay from the F1 flip-flop output (Q) to the F2 data input (IN). The setup time for F2 is then added to the arrival time for F2 to obtain a total time which is used in the timing analysis. The difference between this case and the single-clocked latch design of FIG. 11 is that the latching time (LCT) equals 12 rather than 17, as seen by Equations 1.5 and 2.5. This is a result of the flip-flop design being clocked on an active clock edge, rather than being latched when the CLOCK-1 signal at the LE input is no longer active.

A different analysis occurs where a second clock signal, referred to as CLOCK-2, is introduced into the circuit 220. Where the CLOCK-1 signal is provided to the latch enable LE input of the LATCH-1 222, and a CLOCK-2 signal is provided to the latch enable LE of the LATCH-2 230, the timing analysis described above will change according to the base clock time and period of each of the clock signals.

A multi-clocked latch design can also be analyzed to determine arrival times where two clock signals are provided. For this example, the characteristics illustrated in TABLE 2 can be assumed (illustrated in relative units, typically nanoseconds):

TABLE 2

| PERIOD | | PULSE WIDTH | | TIME OF FIRST PULSE ACTIVATION | |
|--------|--------|--------|--------|--------|--------|
| CLOCK-1 | CLOCK-2 | CLOCK-1 | CLOCK-2 | CLOCK-1 | CLOCK-2 |
| 12 | 12 | 5 | 5 | 0 | 6 |

For this example, the CLOCK-2 signal (not shown) is provided to the LE input of latch-2 230. Where latch-1 222 and latch-2 230 are referred to as L1 and L2 respectively, the following equations apply:

$BCT(L1)=0$ [Equation 3.1]

$BCT(L2)=6$ [Equation 3.2]

$CCT(L1)=0$ [Equation 3.3]

$CCT(L2)=6$ [Equation 3.4]

$LCT(L2)=11$ [Equation 3.5]

$AT(L2)=D(L1.LE,L1.Q)+D(L1.Q,L2.IN)$ [Equation 3.6]

Therefore, in order for the data to be properly latched at latch-2 230 (L2):

$AT(L2)+S(L2) \leq 11$ [Equation 3.7]

In this example, the base clock time (BCT) of latch-2 (L2) 230 is equal to 6, as it is the time lapse occurring from some arbitrarily chosen time t=0, which was chosen as BCT(L1), to the first active edge of the CLOCK-2 signal. Because the first active edge of the CLOCK-2 signal after this reference time occurs at time 6, the BCT of L2 is equal to 6. However, the latching time (LCT) at latch-2 230 is equal to 11, as the falling edge of the CLOCK-2 signal would become inactive at time 11, since the pulse occurs at time 6 and has a pulse width of 5.

As more latching devices, and additional clock signals, are added in the design, the analysis becomes more complex as additional timing paths must be considered, and the relationship between the various clock signals must be properly managed. Examples of such situations are shown in FIGS. 13 and 14, where a multi-clocked design having multiple latching devices, and a multi-clocked design having latches and flip-flops, are shown.

Figure 13:
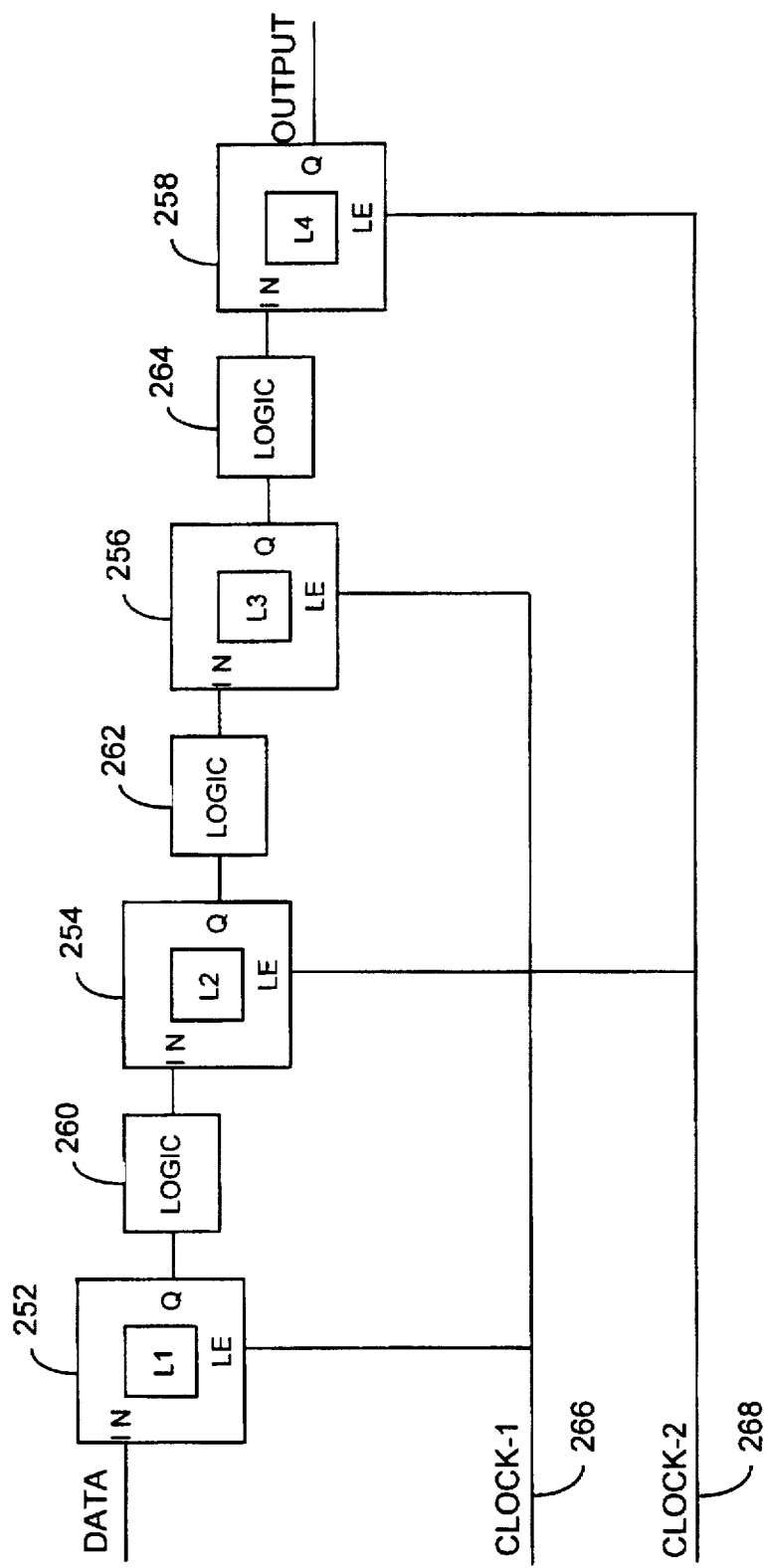
FIG. 13 is a diagram of a circuit having a plurality of latching devices operating under the control of multiple clock signals.
Figure 14:
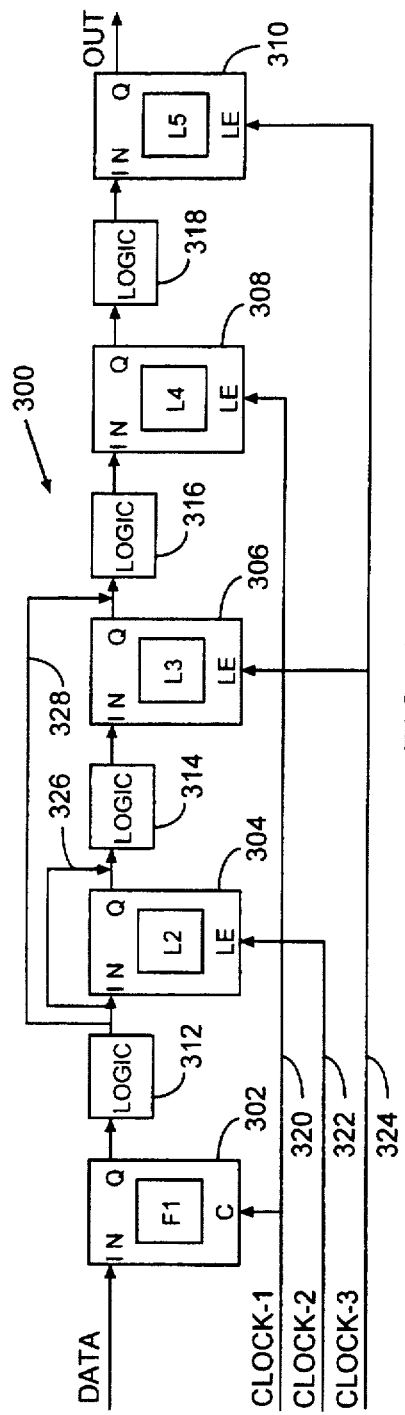
FIG. 14 is a diagram of a circuit having a plurality of state devices operating under the control of multiple clock signals.

FIG. 13 shows a circuit 250 having a plurality of latching devices operating under the control of multiple clock signals. FIG. 13 shows a series of latching devices labeled L1 252, L2 254, L3 256, and L4 258. These latching devices may be separated by combinational logic, illustrated as logic blocks 260, 262 and 264.

The CLOCK-1 signal on line 266 provides the latch enable signal for latches L1 252 and L3 256. Similarly, the CLOCK-2 signal on line 268 provides the latch enable signal for the L2 254 and L4 258. This multi-clocked, pipelined latch design can be analyzed with respect to its timing as the data progresses through the latch pipeline of the circuit 250. The present invention does not require traces to be restarted from a particular reference time, but rather allow the timing analysis to be performed in one pass through the circuit 250, even though there are multiple clocks in the design.

For the example of FIG. 13, the multi-clocked latch design includes four latches, and the timing analysis can occur between any two latches, any three latches in series, or all four latches. For this example, the characteristics illustrated in TABLE 3 can be assumed (illustrated in relative units, typically nanoseconds):

TABLE 3

| PERIOD | | PULSE WIDTH | | TIME OF FIRST PULSE ACTIVATION | |
|---|---|---|---|---|---|
| CLOCK-1 | CLOCK-2 | CLOCK-1 | CLOCK-2 | CLOCK-1 | CLOCK-2 |
| 12 | 12 | 5 | 5 | 0 | 6 |

For a design having the above characteristics, the following equations apply for the timing analysis of a series of three latches, such as latch-2 (L2) 254, latch-3 (L3) 256, and latch-4 (L4) 258, where the latching time of L4 258 is desired:

$$BCT(L2)=6 \quad [\text{Equation 4.1}]$$

$$BCT(L3)=0 \quad [\text{Equation 4.2}]$$

$$BCT(L4)=6 \quad [\text{Equation 4.3}]$$

$$CCT(L2)=6 \quad [\text{Equation 4.4}]$$

$$CCT(L3)=12 \quad [\text{Equation 4.5}]$$

$$CCT(L4)=18 \quad [\text{Equation 4.6}]$$

$$LCT(L4)=23 \quad [\text{Equation 4.7}]$$

$$AT(L4) = D(L2.LE,L2.Q) + D(L2.Q,L3.IN) + D(L3.IN,L3.Q) + D(L3.Q,L4.IN) \quad [\text{Equation 4.8}]$$

Therefore, in order for the data to be properly latched at latch-4 258:

$$AT(L4)+S(L4) \leq 23-6$$

$$AT(L4)+S(L4) \leq 17 \quad [\text{Equation 4.9}]$$

As Equations 4.1 and 4.3 indicate, the base clock time of latch-1 252 was chosen as the time t=0, and therefore the BCT for latch-2 254 and latch-4 258 are equal to 6 because the time of their first active pulses occurs at time 6. Equation 4.2 shows that the BCT for latch-3 256, which is the same as the BCT for latch-1 252, is equal to zero, as the BCT for latch-1 252 was selected to correspond to time t=0.

The current clock times (CCT) of Equations 4.4, 4.5 and 4.6 are the times at which the respective latches receive a clock edge which will latch the data as the data progresses through the series of latches. As shown in Equation 4.4, the CCT for latch-2 (L2) 254 is equal to 6, as it is the time at which a clock pulse will be received at L2 254 when the data from L1 252 is present at L2 254. Equations 4.5 and 4.6 similarly show the CCTs for L3 256 and L4 258, which are calculated in the same manner.

The latched clock time (LCT) for latch-4 (L4) 258 is shown in Equation 4.7 to be 23. This is because the CLOCK-2 signal, which clocks L4 258, has a period of 12, a pulse width of 5, and a first pulse occurring at time 6. Therefore, a pulse will be present from time 6 to time 11, and again from time 18 to time 23. At time 23, the CLOCK-2 signal on line 268 is inactivated, and the signal then at the IN input of L4 258 is latched at the Q output. The arrival time (AT) shown in Equation 4.8 shows the delays from the time the CLOCK-2 signal from line 268 arrives at L2 254 until the data has arrived at the IN input at L4 258.

Equation 4.9 illustrates that because a timing analysis was performed on only L2 254, L3 256 and L4 258, and the AT was calculated only with respect to these three latches, the base clock time (BCT) for L2 254, which is equal to 6, can be subtracted from the LCT. Equation 4.9 therefore provides the timing analysis equation for determining the minimum time referenced from L2 254 at which the data must be at the IN input of L4 258. Where a timing analysis is performed using all four latches, the timing analysis would be referenced from L1 252, and the minimum time would be equal to 23 minus 0 (zero is the base clock time for L1 252), rather than 23 minus 6.

The situation becomes even more complex where a circuit such as the circuit of FIG. 13 includes multiple clock signals, flip-flops and latches are intermixed, and the clock signals have different periods which requires adjustments as described in connection with FIGS. 9 and 10. The present invention does not require these timing analysis traces to be restarted from a particular reference time, but rather allows the timing analysis to be performed in one pass through the circuit, notwithstanding these circuit characteristics.

Referring now to FIG. 14, a circuit 300 having a plurality of state devices operating under the control of multiple clock signals is shown. FIG. 14 shows a series of state devices labeled flip-flop-1 (F1) 302, L2 304, L3 306, L4 308, and L5 310. These devices may be separated by combinational logic, illustrated as logic blocks 312, 314, 316 and 318.

The CLOCK-1 signal on line 320 provides the clock signal and the latch enable signal for F1 302 and L4 308. The CLOCK-2 signal on line 322 provides the latch enable signal for L2 304. The CLOCK-3 signal on line 324 provides the latch enable signal for L3 306 and L5 310.

For the example of FIG. 14, the characteristics illustrated in TABLE 4 can be assumed (illustrated in relative units, typically nanoseconds):

TABLE 4

| PERIOD | | | PULSE WIDTH | | | TIME OF FIRST PULSE ACTIVATION | | |
|---|---|---|---|---|---|---|---|---|
| CLK-1 | CLK-2 | CLK-3 | CLK-1 | CLK-2 | CLK-3 | CLK-1 | CLK-2 | CLK-3 |
| 12 | 12 | 24 | 5 | 5 | 5 | 0 | 6 | 18 |

Figure 15:
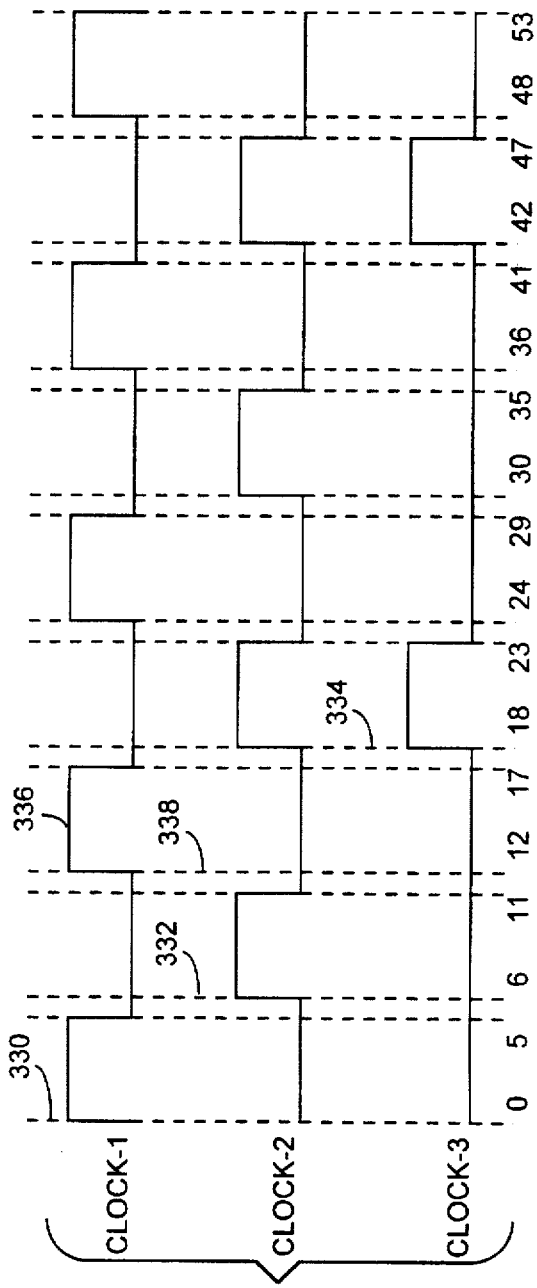
FIG. 15 is a waveform diagram illustrating the clock signals described corresponding to the circuit of FIG. 14.

Referring now to FIG. 15, a waveform diagram illustrating the clock signals described in Table 4 is provided. The CLOCK-1 signal is shown having a period of 12, a pulse width of 5, and the first active (logic high) edge occurs at time t=1 shown at line 330. The CLOCK-2 signal is shown having a period of 12, a pulse width of 5, and the first active (logic high) edge occurs at time t=6 shown at line 332. The CLOCK-3 signal is shown having a period of 24, a pulse width of 5, and the first active (logic high) edge occurs at time t=18 shown at line 334.

For a design having the above characteristics, the first step in the timing analysis is to establish all of the base clock times:

$$BCT(F1)=0 \qquad \text{[Equation 5.1]}$$

$$BCT(L2)=6 \qquad \text{[Equation 5.2]}$$

$$BCT(L3)=18 \qquad \text{[Equation 5.3]}$$

$$BCT(L4)=0 \qquad \text{[Equation 5.4]}$$

$$BCT(L5)=18 \qquad \text{[Equation 5.5]}$$

The timing analysis begins by tracing from F1 302 to L2 304:

$$CCT(F1)=0 \qquad \text{[Equation 5.6]}$$

$$CCT(L2)=6 \qquad \text{[Equation 5.7]}$$

$$LCT(L2)=11 \qquad \text{[Equation 5.8]}$$

$$AT(L2)=0+D(F1.C,F1.Q)+D(F1.Q,L2.IN) \qquad \text{[Equation 5.9]}$$

$$AT(L2)+S(L2) \leq 11 \qquad \text{[Equation 5.10]}$$

The value of AT(L2) will be propagated forward as the timing analysis continues. The timing analysis then continues by tracing to L3 306. This involves various possible traces, including a trace from F1 302 to L2 304 to L3 306, a trace directly from F1 302 to L3 306 via line 326, and a trace from L2 304 to L3 306. First, for the trace from F1 302 to L2 304 to L3 306, the analysis from Equations 5.6–5.10 can be continued:

$$CCT(L3)=18 \qquad \text{[Equation 5.11]}$$

$$LCT(L3)=23 \qquad \text{[Equation 5.12]}$$

$$AT(L3)=AT(L2)+D(L2.IN,L2.Q)+D(L2.Q,L3.IN) \qquad \text{[Equation 5.13]}$$

For the trace directly from F1 302 to L3 306 by way of line 326, FIGS. 14 and 15 show that another pulse 336 of the CLOCK-1 signal at F1 302 occurs before the calculated CCT at L3 306. Therefore, an adjustment is required as follows:

$$SA=12 \qquad \text{[Equation 5.14]}$$

where SA refers to a source adjustment. The source adjustment equals 12 because it is at time t=12 on line 338 at which the significant CLOCK-1 pulse occurs with respect to the CLOCK-3 pulse occurring at time t=18. Therefore, with respect to time t=0, an adjustment of 12 must be made. This results in a second arrival time equation for L3 306:

$$AT(L3)=SA+D(F1.C,F1.Q)+D(F1.Q,L3.IN) \qquad \text{[Equation 5.15]}$$

For the trace from L2 304 to L3 306, the following arrival time equation can be formulated using the previous equations to form yet another arrival time equation for L3 306:

$$\begin{aligned} AT(L3) &= CCT(L2) + D(L2.LE,L2.Q) + \\ &\quad D(L2.Q,L3.IN) \\ &= 6 + D(L2.LE,L2.Q) + \\ &\quad D(L2.Q,L3.IN) \end{aligned} \qquad \text{[Equation 5.16]}$$

Since the current clock time values (CCT) for L3 306 are the same for all three traces reaching L3, the "worst-case" arrival time (AT) at L3 is the maximum arrival time of the three traces. Therefore, the maximum arrival time from Equation 5.13, 5.15, and 5.16 is used to perform the timing analysis, and is used in the following equation:

$$AT(L3)+S(L3) \leq 23 \qquad \text{[Equation 5.17]}$$

where 23 is the latching time at L3 306.

Turning now to the traces reaching L4 308 in FIG. 14, there are traces through L3 306 which are continuations of the traces analyzed above, such as the trace shown from F1 302 to L2 304 to L3 306 to L4 308. Other traces reaching L4 308 include a trace directly from F1 302 to L4 308 via line 328, and a trace from L3 306 to L4 308. First, for the traces through L3 306, the analysis from Equations 5.6–5.13 can be continued:

$$CCT(L4)=24 \qquad \text{[Equation 5.18]}$$

$$LCT(L4)=29 \qquad \text{[Equation 5.19]}$$

$$AT(L4)=AT(L3)+D(L3.IN,L3.Q)+D(L3.Q,L4.IN) \qquad \text{[Equation 5.20]}$$

For the trace from L3 306 to L4 308, the following arrival time equation can be formulated using the previous equations to form yet another arrival time equation for L4 308:

$$\begin{aligned} AT(L4) &= CCT(L3) + D(L3.LE,L3.Q) + \\ &\quad D(L3.Q,L4.IN) \\ &= 18 + D(L3.LE,L3.Q) + \\ &\quad D(L3.Q,L4.IN) \end{aligned} \qquad \text{[Equation 5.21]}$$

For the trace directly from F1 302 to L4 308 by way of line 328, FIGS. 14 and 15 show that the CLOCK-1 signal clocks both F1 302 and L4 308. This results in the following equations:

$$CCT(F1)=0 \qquad \text{[Equation 5.22]}$$

$$CCT(L4)=12 \qquad \text{[Equation 5.23]}$$

$$LCT(L4)=17 \qquad \text{[Equation 5.24]}$$

$$AT(L4)=D(F1.C,F1.Q)+D(F1.Q,L4.IN) \qquad \text{[Equation 5.25]}$$

Since the current clock time values (CCT) for L4 308 are the same for the trace from F1 302 to L2 304 to L3 306 to L4 308, and for the trace from L3 306 to L4 308, only the "worst-case" arrival time (AT) of these two arrival times needs to be checked and propagated forward:

$$AT(L4)+S(L4) \leq 29 \qquad \text{[Equation 5.26]}$$

where 29 is the latching time at L4 308.

However, because the trace directly from F1 302 to L4 308 by way of line 328 resulted in a different value for the current clock time (CCT) at L4 308, this arrival time also needs to be checked and propagated forward:

$$AT(L4)+S(L4) \leq 17 \quad \text{[Equation 5.27]}$$

Therefore, both Equations 5.26 and 5.27 are analyzed to determine whether timing problems exist.

Traces reaching L5 310 in FIG. 14 involve a similar analysis. There are traces through L4 308 which are continuations of the traces analyzed above, such as the trace shown from F1 302 to L2 304 to L3 306 to L4 308 to L5 310. Another trace reaching L5 310 is shown from L4 308 to L5 310. First, for the traces through L4 308, the analysis from Equations 5.6–5.13 and 5.18–5.20 can be continued, recalling that for the trace from F1 302 to L2 304 to L3 306 to L4 308 to L5 310 CCT(L4)=24:

$$CCT(L5)=42 \quad \text{[Equation 5.28]}$$

$$LCT(L5)=47 \quad \text{[Equation 5.29]}$$

Because another pulse of the CLOCK-1 signal can occur before the calculated CCT at L5 310, a source adjustment is made:

$$SA=12 \quad \text{[Equation 5.30]}$$

$$AT(L5)=AT(L4)+SA+D(L4.IN,L4.Q)+D(L4.Q,L5.IN) \quad \text{[Equation 5.31]}$$

Also, where the trace went directly from F1 302 to L4 308 by way of line 328, the CCT(L4) was equal to 12, as was described in Equation 5.23. In this case, the following equations apply:

$$CCT(L5)=18 \quad \text{[Equation 5.32]}$$

$$LCT(L5)=23 \quad \text{[Equation 5.33]}$$

$$AT(L5)=AT(L4)+D(L4.IN,L4.Q)+D(L4.Q,L5.IN) \quad \text{[Equation 5.34]}$$

For the trace from L4 308 to L5 310, the following equations apply:

$$CCT(L4)=0 \quad \text{[Equation 5.35]}$$

$$CCT(L5)=18 \quad \text{[Equation 5.36]}$$

$$LCT(L5)=23 \quad \text{[Equation 5.37]}$$

Because another pulse of the CLOCK-1 signal can occur before the calculated CCT at L5 310, a source adjustment is made for the trace from L4 308 to L5 310:

$$SA=12 \quad \text{[Equation 5.38]}$$

$$AT(L5)=SA+D(L4.IN,L4.Q)+D(L4.Q,L5.IN) \quad \text{[Equation 5.39]}$$

The calculations for AT(L5) in Equations 5.34 and 5.39 above result in the same current clock time (CCT) at L5 310. Therefore, the "worst-case" arrival time (AT) at L5 is the maximum delay of the two traces. The maximum delay from Equations 5.34 and 5.39 is used to perform the timing analysis, and is used in the following equation:

$$AT(L5)+S(L5) \leq 23 \quad \text{[Equation 5.40]}$$

where 23 is the latching time at L5 310.

The calculation for AT(L5) in Equation 5.31 resulted in a unique current clock time (CCT) at L5 310, having a CCT(L5) equal to 42, as shown in Equation 5.28. Therefore, a separate check on the arrival time (AT) must be performed, resulting in the following equation:

$$AT(L5)+S(L5) \leq 47 \quad \text{[Equation 5.41]}$$

These examples illustrate the timing analysis in accordance with the present invention. It should be noted that the determination of clock times for "hold" timing checks are determined in an analogous manner, with the exception that no propagation through latches needs to be taken into account. Hold times are lengths of time after the clocking of a state device in which the input data must remain unchanged. Therefore, in view of the description set forth herein, clock time determination for "hold" checks rather than "setup" checks will be readily apparent to one skilled in the art.

Figure 16:
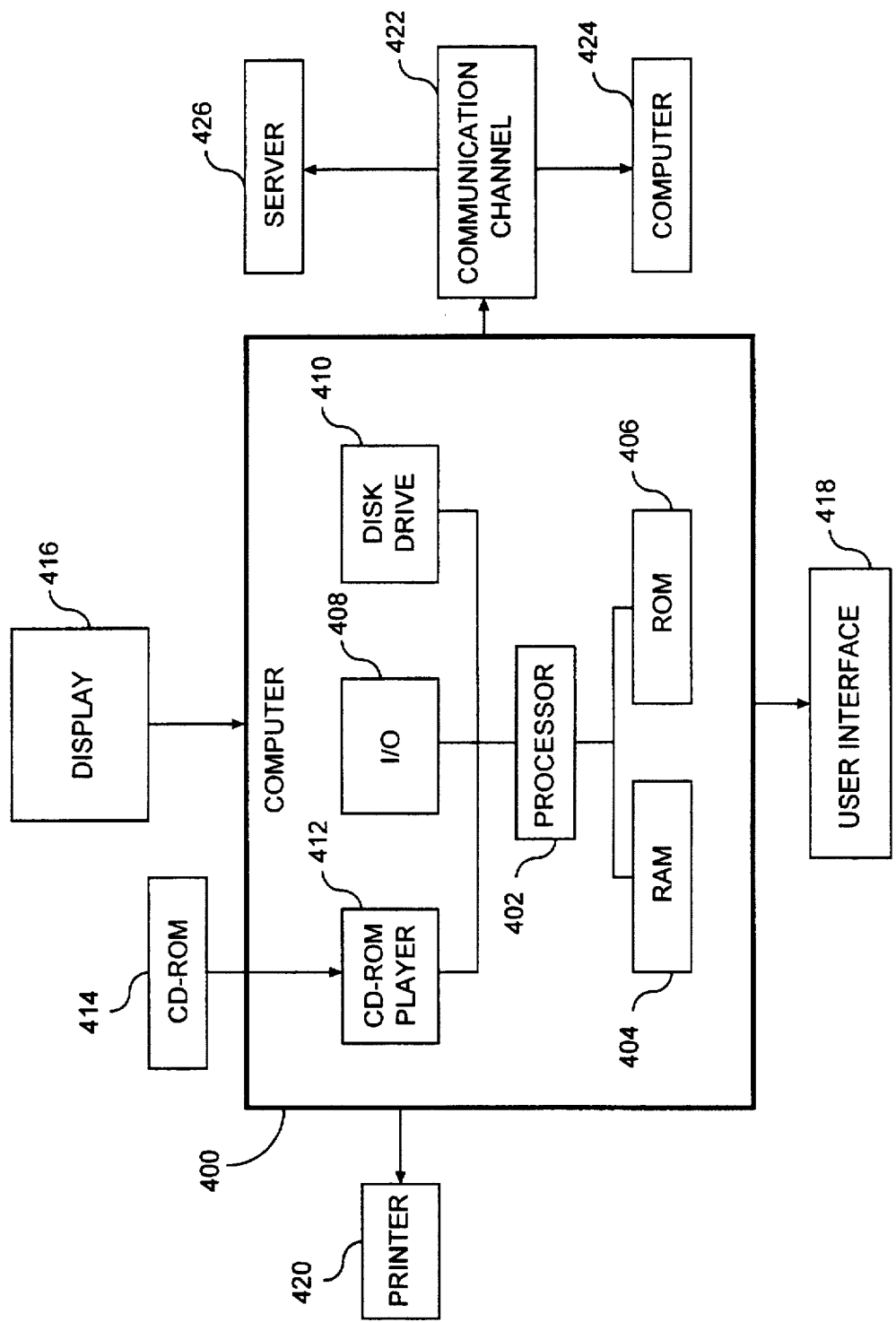
FIG. 16 is a system block diagram of a typical computer system capable of controlling the timing analysis system of the present invention.

Referring now to FIG. 16, a system block diagram of a computer system 400 is shown. The computer system 400 is coupled to a network of other computers and servers which together provide a distributed timing analysis capability. A computer 400 suitable for calculating timing parameters and timing errors in accordance with the present invention typically includes a central processor (CPU) 402 coupled to random access memory (RAM) 404 and read-only memory (ROM) 406. The processor 402 communicates with other internal and external components through input/output (I/O) circuitry and bussing 408. The computer 400 may also include one or more data storage devices, including hard and floppy disk drives 410 and a CD-ROM drive 412. In one embodiment, software containing the timing analysis software of the present invention may be stored and distributed on a CD-ROM 414, which may be inserted into, and read by, the CD-ROM drive 412. The computer 400 is also coupled to a display 416, a user interface 418, such as a mouse and keyboard, and a printer 420. The user typically inputs, modifies, and executes the various timing analysis program routines by interfacing with the computer through the user interface 418 and display 416.

The I/O circuit and bus 408 of the computer 400 is preferably coupled to a communication channel 422 which, in turn, provides a means to communicate with one or more remote computers 424, server 426, and other external systems, such as those that constitute the Internet. In one embodiment, a user may initiate a timing analysis routine from a remote computer 424 which communicates with an external server, such as server 426, for purposes of browsing, linking and importing objects that may be stored on the server 426. Accordingly, the timing analysis routines in accordance with the present invention may be operable on a stand-alone computer system, as well as on a distributed network system.

The invention has been described in its presently contemplated best mode, and it is clear that it is susceptible to various modifications, modes of operation and embodiments, all within the ability and skill of those skilled in the art and without the exercise of further inventive activity. Accordingly, what is intended to be protected by Letters Patents is set forth in the appended claims.

What is claimed is:

1. A method for detecting timing errors in a system having at least a first and a second state device clocked by first and second clock signals respectively, the first and second state devices having associated expected timing parameters, the method comprising the steps of:

(a) designating a reference time;

(b) calculating a time differential between successive triggering edges of the first and second clock signals as measured from the reference time; and (c) comparing the expected timing parameters to the time differential.

2. The method of claim 1, wherein the step of designating a reference time comprises the step of selecting an arbitrary time prior to the time of the triggering edges of the first and second clock signals.

3. The method of claim 1, wherein the step of designating a reference time comprises the step of assigning a clock pulse of a reference clock signal as the reference time.

4. The method of claim 3, wherein the reference clock signal is selected from the group comprising the first clock signal and the second clock signal.

5. The method of claim 1, wherein the system includes a third state device clocked by a third clock signal, and wherein the step of calculating a time differential comprises the step of calculating a second time differential between successive triggering edges of the second and third clock signals as measured from the reference time.

6. The method of claim 1, wherein the step of calculating a time differential comprises the steps of:

(i) calculating a first amount of time from the reference time to the occurrence of the triggering edge of the first clock signal;

(ii) calculating a second amount of time from the reference time to the occurrence of the next one of the triggering edges of the second clock signal; and (iii) calculating the difference between the first amount of time and the second amount of time.

7. The method of claim 6, wherein the step of designating a reference time comprises the step of assigning a clock pulse of the first clock signal as the reference time so that the first amount of time is equal to zero.

8. The method of claim 1, wherein the step of calculating a time differential comprises the steps of:

(i) storing a period time and an offset for each of the first and second clock signals, the offsets being a time, measured from the reference time, of the first occurring pulse of each of the first and second clock signals occurring simultaneously or subsequent to the reference time;

(ii) setting a current clock time value equal to the offset of the first clock signal; and (iii) calculating a variance time from the current clock time value to the occurrence of the next one of the triggering edges of the second clock signal.

9. The method of claim 8, wherein the calculating step comprises the step of equating the variance time to the offset of the second clock signal, where the offset of the second clock signal is greater than the current clock time value.

10. The method of claim 8, wherein the calculating step comprises the step of equating the variance time to a sum of the offset and the period time of the second clock signal, where the offset of the second clock signal is less than the current clock time value.

11. The method of claim 10, further comprising the step of comparing the sum to the current clock time value, and equating the variance time to the sum where the sum is greater than the current clock time value.

12. The method of claim 10, further comprising the steps of:

(a) comparing the sum to the current clock time value;

(b) repeatedly adding the period time of the second clock signal to the sum until a resulting sum is greater than the current clock time value; and (c) equating the variance time to the resulting sum.

13. The method of claim 8, further comprising the step of locating the triggering edge of the first clock signal by determining the time of a pulse of the first clock signal immediately preceding the triggering edge of the second clock signal.

14. The method of claim 13, wherein the step of locating the triggering edge comprises the step of repeatedly adding the period time of the first clock signal to the current clock time value to generate a sum, until the difference between the current clock time value and the sum is less than or equal to the first clock signal's period time.

15. A method for detecting timing errors in a state machine having a plurality of successive stages of state devices, each of the successive stages being clocked by a different clock signal, the method comprising the steps of:

(a) designating a reference time;

(b) selecting two consecutive successive stages as a first stage and a second stage;

(c) calculating first and second anticipated times for triggering edges of first and second clock signals associated with the first and second stages respectively, the first and second anticipated times being calculated with respect to the reference time;

(d) comparing expected timing parameters for the first and second stages to the difference between the first and second anticipated times; and (e) returning to step (b) until all of the consecutive successive stages have been selected.

16. The method of claim 15, wherein the step of designating a reference time comprises the step of equating the reference time with a pulse from any one of the different clock signals.

17. The method of claim 15, wherein the calculating step comprises the steps of:

(i) storing a period time and an offset for each of the first and second clock signals, the offsets being a time, measured from the reference time, of the first pulse of each of the first and second clock signals occurring simultaneously or subsequent to the reference time;

(ii) setting a current clock time value equal to the offset of the first clock signal; and (iii) calculating a variance time from the current clock time value to the occurrence of the next one of the triggering edges of the second clock signal.

18. The method of claim 17, wherein the calculating step comprises the step of equating the variance time to the offset of the second clock signal, where the offset of the second clock signal is greater than the current clock time value.

19. The method of claim 17, wherein the calculating step comprises the step of equating the variance time to a sum of the offset and the period time of the second clock signal, where the offset of the second clock signal is less than or equal to the current clock time value.

20. The method of claim 19, further comprising the step of comparing the sum to the current clock time value, and equating the variance time to the sum where the sum is greater than the current clock time value.

21. The method of claim 19, further comprising the steps of:

(a) comparing the sum to the current clock time value;

(b) repeatedly adding the period time of the second clock signal to the sum until a resulting sum is greater than the current clock time value; and (c) equating the variance time to the resulting sum.

22. The method of claim 17, further comprising the step of locating the triggering edge of the first clock signal by determining the time of a pulse of the first clock signal immediately preceding the triggering edge of the second clock signal.

23. The method of claim 22, wherein the step of locating the triggering edge comprises the step of repeatedly adding the period time of the first clock signal to the current clock time value to generate a sum, until the difference between the current clock time value and the sum is less than the first clock signal's period time.

24. A method for detecting timing errors in a system having at least a first and a second state device clocked by first and second clock signals respectively, the first and second state devices having associated expected timing parameters, the method comprising the steps of:

(a) designating a reference time;

(b) storing a time offset with respect to the reference time for each of the first and second clock signals;

(c) setting a current clock time value equal to the time offset of the first clock signal;

(d) calculating a time differential between the current clock time value and a calculated occurrence of the next pulse of the second clock signal; and (e) comparing the time differential to expected timing parameters to generate a timing error signal where the expected timing parameters are greater than the time differential.

25. A system for detecting timing errors in a state machine having at least first and second state devices clocked by first and second clock signals respectively, the system comprising:

a user interface to enter a reference time, and to enter offset values for each of the first and second clock signals, wherein the offset values represent a time offset from the reference time;

storage means for storing the reference time and the offset values for the first and second clock signals;

processing means, coupled to the user interface and the storage medium, programmed for calculating a time differential between successive triggering edges of the first and second clock signals as measured from their respective offset values, and for comparing expected timing parameters to the time differential.

26. A computer program product for use with a computer system having a user interface, the computer system for detecting timing errors in a state machine having at least a first and a second state device clocked by first and second clock signals respectively, the computer program product comprising:

a computer readable medium having computer program code embodied thereon, the computer program code including:

(a) program code means for designating a reference time;

(b) program code means for calculating a time differential between successive triggering edges of the first and second clock signals as measured from the reference time; and (c) program code means for comparing the expected timing parameters to the time differential.

27. A method for analyzing timing characteristics in a system having a network of state devices, comprising the steps of:

assigning clock signal parameters to each of the state devices;

calculating signal trace delay information, using the clock signal parameters, for each signal path from a first one or more of the state devices to successively coupled ones of the state devices, and from the successively coupled ones of the state devices to remaining state devices in the network of state devices, further comprising the steps of:

storing the signal trace delay information for each signal path while propagating through the network of state devices; and progressively propagating through each stage of the network of state devices by calculating the signal trace delay information at each state device as measured from the stored signal trace delay information from preceding stages, rather than measured from a common time reference.

* * * * *